(12) United States Patent
Renzi et al.

(10) Patent No.: US 8,093,624 B1
(45) Date of Patent: Jan. 10, 2012

(54) HIGH FILL-FACTOR AVALANCHE PHOTODIODE

(75) Inventors: Matthew J. Renzi, Arlington, MA (US); Brian F. Aull, Cambridge, MA (US); Robert K. Reich, Tyngsborough, MA (US); Bernard B. Kosicki, Acton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 821 days.

(21) Appl. No.: 11/354,799

(22) Filed: Feb. 15, 2006

(51) Int. Cl.
*H01L 31/107* (2006.01)

(52) U.S. Cl. .................. 257/186; 257/E33.076

(58) Field of Classification Search .................. 257/186, 257/E33.076
See application file for complete search history.

(56) References Cited

U.S. PATENT DOCUMENTS

| | | | |
|---|---|---|---|
| 5,270,558 | A | 12/1993 | Reich et al. |
| 5,892,575 | A | 4/1999 | Marino |
| 6,384,663 | B2 | 5/2002 | Cova et al. |
| 6,541,752 | B2 | 4/2003 | Zappa et al. |
| 6,858,912 | B2 | 2/2005 | Marshall et al. |
| 2005/0012033 | A1 | 1/2005 | Stern et al. |
| 2005/0258449 | A1 | 11/2005 | Lutz et al. |

FOREIGN PATENT DOCUMENTS

WO   WO 03/003476   1/1920

OTHER PUBLICATIONS

Aull et al., "Geiger-Mode Avalanche Photodiodes for Three-Dimensional Imaging," Lincoln Laboratory Journal, V. 13, N. 2, pp. 335-350, 2002.
Albota et al., "Three-Dimensional Imaging Laser Radars with Geiger-Mode Avalanche Photodiode Arrays," Lincoln Laboratory Journal, V. 13, N. 2, pp. 351-370, 2002.
Giudice et al., "A process and deep level evaluation tool: afterpulsing in avalanche junctions," EP Solid-State Device Research (ESSDERC '03), pp. 347-350, Sep. 16, 2003.
Pauchard et al, "Single-Photon Counters Get a Second Wind," Photonics Spectra, pp. 102-105, Mar. 2005.
Renzi et al., "High-Fill-Factor Silicon Geiger-Mode Avalanche Photodiode Arrays for Photon-Counting Applications," Solid State Research Report, MIT Lincoln Laboratory, 2005:1, pp. 29-33, Jun. 2005.
Lutz et al., The Avalanche Drift Diode: A New Detector Concept for Single Photon Detection, IEEE Trans. on Nuclear Science, V. 52, N. 4, pp. 1156-1159, Aug. 2005.
Lutz et al., "Development of avalanche-drift and avalanche-pixel detectors for single photon detection and imaging in the optical regime," Nuclear Instr. and Methods in Phys. Res. A, V. 567, pp. 129-132, Jun. 2006.
Merck et al., "Timing properties of an avalanche diode for single photon counting," Nuclear Instr. and Methods in Phys. Res. A, V. 567, pp. 272-275, Jun. 2006.

*Primary Examiner* — Matthew Reames
(74) *Attorney, Agent, or Firm* — Theresa A. Lober (57) ABSTRACT

A photodiode is provided by the invention, including an n-type active region and a p-type active region. A first one of the n-type and p-type active regions is disposed in a semiconductor substrate at a first substrate surface. A second one of the n-type and p-type active regions includes a high-field zone disposed beneath the first one of the active regions at a first depth in the substrate, a mid-field zone disposed laterally outward of the first active region at a second depth in the substrate greater than the first depth, and a step zone connecting the high-field zone and the mid-field zone in the substrate.

26 Claims, 10 Drawing Sheets

FIG.9B

HIGH FILL-FACTOR AVALANCHE PHOTODIODE

STATEMENT REGARDING FEDERALLY SPONSORED RESEARCH

This invention was made with Government support under Contract No. F19628-00-C-0002 awarded by The Air Force. The Government has certain rights in the invention.

BACKGROUND OF INVENTION

This invention relates generally to solid state photodiodes, and in particular relates to avalanche photodiode (APD) device design and fabrication.

Avalanche photodiodes are becoming a popular solid state microfabricated device for illumination detection applications. Avalanche photodiodes that are silicon-based can be microfabricated compatibly with standard CMOS processing. When the p-n junction or p-i-n region of an avalanche photodiode is appropriately reverse-biased, illumination of the APD results in photon absorption that generates electron-hole pairs at a region of high electric field in the vicinity of the reverse bias. This electron-hole pair generation produces an electrical signal corresponding to detection of the illumination.

There are two general modes of operation of APDs. In a first mode, known as the linear mode, the reverse bias voltage of the APD is held below the breakdown voltage characteristic of the APD. Under this condition, each photon absorbed at the APD produces on average a finite number of electron-hole pairs, resulting in a characteristic avalanche gain factor that is typically on the order of tens or hundreds. The average photocurrent produced by a linear mode APD is strictly proportional to the incident photon flux.

Although quite adequate for many applications, the signal noise typically associated with linear mode APD operation can be unacceptable for some applications. The linear mode avalanche gain factor is statistically variable, resulting in so-called multiplication noise, which gets progressively worse as the gain factor is increased by raising the APD reverse bias. Once the multiplication noise dominates the noise of signal readout circuitry, the APD signal-to-noise ratio is generally unacceptable for many applications.

The second mode of APD operation overcomes this noise limitation. In this second mode, known as Geiger mode (GM), the APD reverse bias voltage is held above the breakdown voltage characteristic of the APD. Under this condition, the population of electrons and holes generated by photons collected by the APD high electric field region grows exponentially. As the reverse bias is further increased above the breakdown voltage, the exponential growth factor also increases, but the high electric field is reduced by the corresponding growth of avalanche current, given a resistive high field region as is conventional. Ultimately a steady state condition is reached in which charge generation and current flow are balanced, producing a stable APD avalanche current level and a well-defined avalanche turn-on transient time, typically on the order of tens of picoseconds. The avalanche current initiated by a single photon absorbed by a GM-APD therefore produces a well-defined, resistance-limited signal.

Thus, unlike linear mode APD operation, in GM-APD operation, multiplication noise does not apply. The total electron-hole pairs produced by a stable GM-APD avalanche event is fixed by external circuitry, not by statistics of the electron-hole pair generation process. Therefore, unlike linear mode operation, GM-APD operation is not limited by noise; the GM signal can be detected with quantum-limited sensitivity and digitized with effectively noiseless signal readout. This noiseless signal characteristic is particularly well-suited for many advanced illumination detection applications.

Operated correctly, the GM-APD device enables illumination detection to produce optical intensity information on the scale of individual photons. The GM avalanche current pulse produced by the absorption of one photon is indistinguishable from that produced by the absorption of many photons during a given detection period, due to a finite diode quench and reset period. Therefore, GM-APD operation is best directed to detection of single photon events per period. GM-APD operation is accordingly suitable for many important applications, e.g., for low and ultra-low light level imaging applications. The noiseless generation of a fast illumination detection signal is also particularly advantageous for enabling photon detection-based electronic triggering systems. Thus a wide range of systems are particularly well addressed by the sensitive time-of-arrival and/or incremental-count signals that can be produced based on GM-APD avalanche events.

To enable GM-APD operation as opposed to or in addition to linear mode APD operation, an APD structure typically is provided with a designated high electric field region central to the device structure.

Conventionally, this high field region is defined by device features that tailor the electric field profile of the device, in operation, to limit the extent of the high field region. By well-defining the high field region, electric field breakdown at edges of device structures can be eliminated or minimized. In addition, the dark current, i.e., the current produced by the APD under non-illumination conditions, can generally be minimized. Due to the single-photon scale of GM-APD illumination detection and the sensitivity typical of GM-APD applications, such minimization of dark current is generally considered critical for practical applications.

In order to prevent edge breakdown effects, conventional GM-APD structures generally include features that dramatically reduce the fill factor of the device. Specifically, the fraction of the GM-APD structure that is available for photon absorption is generally quite limited by the device features and corresponding field profile employed for control of the GM-APD electric field. As a result, the sensitivity of a conventional GM-APD device can be too low for many important applications. To compensate for this limitation, optical and holographic systems have been employed to concentrate incident light to an intended GM-APD high field device region, in an effort to reclaim absorption efficiency that is lost due to low fill factor. But such compensation systems cannot always be employed. Many low light level applications, such as photon counting applications, require low f numbers and/or small pixel dimensions. In such cases traditional back-illuminated GM-APD structures cannot accommodate an optical system and thus sensitivity cannot be improved with optical focusing techniques. Without an optical compensation system, the reduced GM-APD sensitivity is unacceptable for many important applications.

SUMMARY OF THE INVENTION

The invention provides an avalanche photodiode having a device structure that enables a fill-factor approaching 100% at visible and near-infrared wavelengths, eliminating the need for optical focusing techniques. In the photodiode of the invention, there is provided an n-type active region and a p-type active region. A first one of the n-type and p-type active regions is disposed in a semiconductor substrate at a first substrate surface. A second one of the n-type and p-type active regions includes a high-field zone disposed beneath the first one of the active regions at a first depth in the substrate, a mid-field zone disposed laterally outward of the first active region at a second depth in the substrate greater than the first depth, and a step zone connecting the high-field zone and the mid-field zone in the substrate.

With this configuration, the photodiode structure of the invention prevents non-avalanche photoelectron collection by substantially inhibiting photoelectron paths that circumvent the high-field avalanche region of the device. The resulting high fill-factor is enhanced by a backside illumination configuration for the APD device, whereby illumination collection is substantially unobstructed.

These characteristics render the APD structure of the invention superior for a range of photon counting and electronic triggering applications, and low light level applications for both the linear and Geiger modes of APD operation. Other features and advantages of the invention will be apparent from the following description and accompanying drawings, and from the claims.

DETAILED DESCRIPTION OF THE INVENTION

Figure 1A:
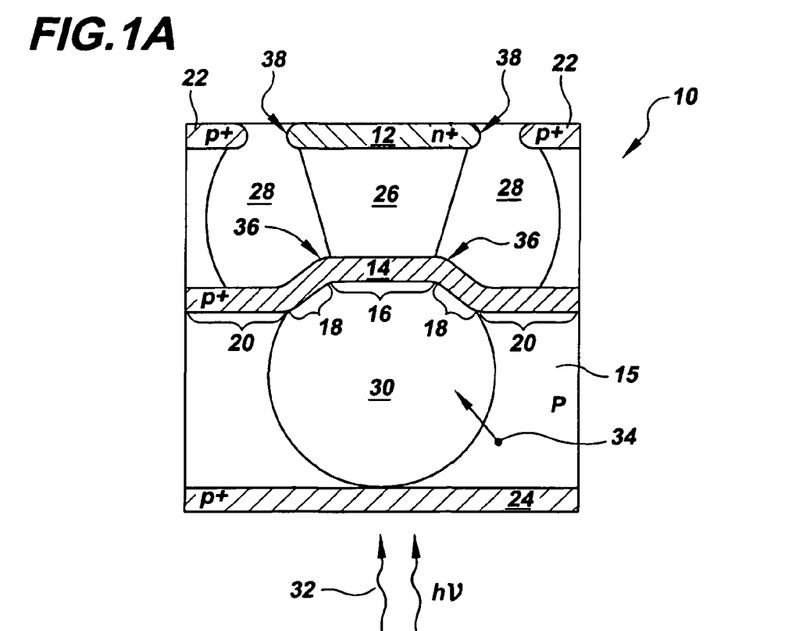
FIGS. 1A-1B are schematic cross-sectional views of two example avalanche photodiode device structures provided by the invention.

FIG. 1A is a schematic cross-sectional representation of an example avalanche photodiode (APD) pixel 10 provided by the invention. The regions of the device are not shown to scale for clarity. The example APD shown presumes the use of a p-type silicon substrate, but such is not in general required, as discussed below. In the example shown in FIG. 1A, the APD 10 includes an $n^+$ active region 12 and a $p^+$ active region 14 provided in a p-type substrate or substrate layer 15. The $n^+$ active region is in this example configured at the substrate surface to operate as a cathode. The $p^+$ active region 14 is a stepped buried layer having three distinct zones, namely, a high-field zone 16, a step zone 18, and a mid-field zone 20. Together, the $n^+$ and $p^+$ active regions define an avalanche region of the photodiode, as explained in detail below.

Conventional channel stop regions 22, here provided as $p^+$ regions, are located at the edges of the APD. In the example shown in FIG. 1A, the device is configured for backside illumination, but such is not required, as discussed below. For the backside illumination configuration of FIG. 1A, the backside of the substrate is configured with a heavily doped region 24, here a $p^+$ region, to provide a uniform voltage across the illumination collection surface.

With this device structure, a voltage can be applied between the $n^+$ active region 12 and the backside $p^+$ region 24, here functioning as a cathode and anode, respectively, to bias the substrate region between the $n^+$ cathode and the $p^+$ buried layer 14. When the applied voltage between the anode and the cathode is sufficient to reverse bias the region between the $n^+$ cathode 12 and the $p^+$ buried layer 14 above the breakdown voltage characteristic for the device, a high electric field region 26 is produced above the high-field zone 16 of the buried layer. At the locations above the step zone 18 and mid-field zone 20 of the buried layer 14, the increased distance between the $n^+$ cathode and the buried layer at these zones, relative to the central high-field zone of the buried layer, results in a reduced electric field, here termed the mid-field region 28. Below the buried layer 14, between the buried layer and the anode 24, there is produced a low electric field, resulting in a low-field region 30.

With this electric field profile, illumination 32 directed to the backside of the device results in absorption of photoelectrons 34 at the anode, into the substrate, for collection via diffusion and/or drift into the low-field region 30, operating as a collection region, or absorber region, for the device. Photoelectrons in the absorber region diffuse and drift to the buried layer 14 and are accelerated through the high-field avalanche region 26, producing an avalanche current. Due to the electric field profile set up by the stepped nature of the buried layer 14, photoelectrons are attracted from the absorption region to the high-field region, rather than the mid-field region, to establish an avalanche current.

The avalanche photodiode of the invention enables a substantially 100% fill-factor by preventing the region 28 of the mid-field electric field profile from extending from the cathode all the way to the backside anode 24 of the substrate layer 15, through the illumination collection region between the anode 24 and the buried layer 14. The mid-field zone 20 of the stepped buried layer 14 terminates the mid-field region of the electric field from the cathode at the mid-field zone 20 instead of the anode 24. With this arrangement, the substrate 15 below the buried layer 14 is biased such that photoelectrons absorbed in the substrate below the buried layer 14 have no path other than to the absorption region 30. There is no direct path through an electric field region between the anode and the cathode and thus no direct path of diffusion and/or drift between the anode and the cathode. As a result, substantially all illumination at the backside of the substrate is collected by the absorption region for direction to the high-field region and production of an avalanche event. It is to be recognized that such absorption is wavelength-dependent; photons directly absorbed in the mid-field region 28 will not be collected by the APD structure.

If the mid-field zone 20 of the buried layer were not present, the mid-field region 28 of the electric field profile could extend from the cathode all the way through the substrate to the anode. In such a scenario, photoelectrons collected in that mid-field region could bypass the avalanche region and travel directly from the anode to the cathode. This non-avalanche collection of photoelectrons would dramatically reduce the effective fill-factor of the device. In great contrast, the photodiode structure of the invention prevents non-avalanche photoelectron collection by inhibiting photoelectron paths that circumvent the high-field avalanche region of the device.

The backside illumination configuration in the example of FIG. 1A enhances the fill-factor of the device by providing a substantially unobstructed illumination collection surface. But in accordance with the invention, front-side illumination configurations can also be employed, where appropriate, in the manner described below. Where near 100% fill-factor is desirable, the backside illumination configuration of FIG. 1A can be preferred. With this device design, illumination is collected at an unobstructed illumination collection surface and directed to the high-field avalanche region. Substantially all incoming illumination is captured at the collection surface anode, and photoelectrons are not lost to non-avalanche collection between the anode and cathode. Superior high-fill-factor avalanche photodiode operation results.

Turning now to specific details of the photodiode structure in the example of FIG. 1A, the $n^+$ cathode 12 and the $p^+$ anode 24 are of sufficient doping to enable ohmic contact to those regions. The $n^+$ active cathode region 12 and $p^+$ buried layer active region 14 are shown only schematically, and their locations as-shown represent, e.g., locations of peak doping. The impurity doping profiles of these two regions, through the depth of the substrate, are selected such that the $n^+$ cathode 12 and the central high-field zone 16 of the $p^+$ buried layer 14 define the high-field avalanche region between them.

Figure 2A:
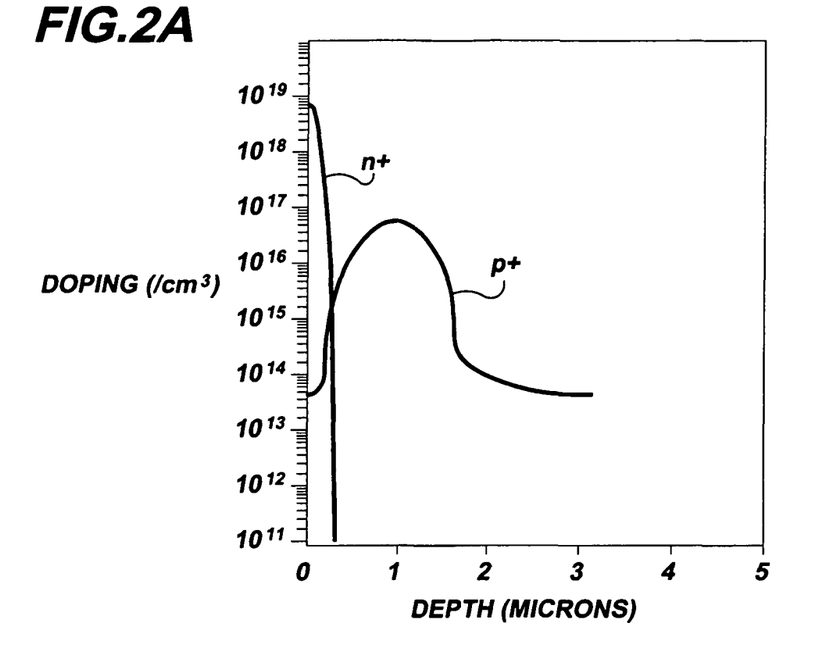
FIGS. 2A-2B are plots of ion doping profiles, as a function of depth in a silicon substrate, for the $n^+$ cathode and $p^+$ buried layer in the structure of FIG. 1A, for a doping profile resulting in a p-n junction, and a doping profile resulting in a p-π-n structure, respectively.
Figure 2B:
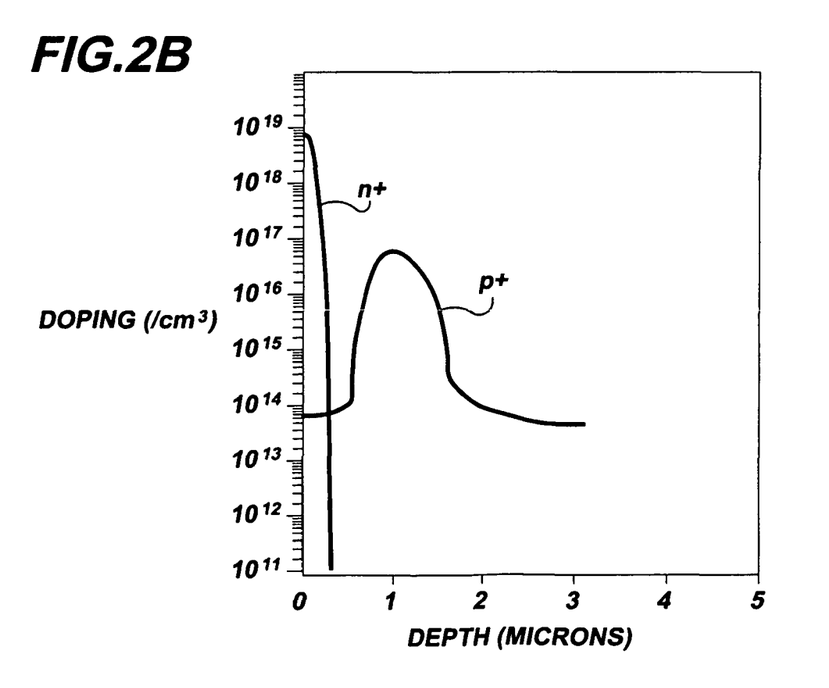

In accordance with the invention, the doping profile of the $n^+$ cathode 12 and the $p^+$ high-field zone 16 can overlap or be non-overlapping, resulting in a p-n structure or p-π-n structure, respectively, with it here denoting a lightly doped region, e.g., of the substrate background doping. Both structures are contemplated and operational in accordance with the invention. FIGS. 2A-2B illustrate the two conditions, plotting the doping depth profile of the device through the $n^+$ cathode and the high-field zone of the $p^+$ buried layer. For the doping conditions plotted in FIG. 2A, the cathode doping depth profile overlaps with that of the buried layer high-field zone due to, e.g., tailing or diffusion processing effects. A distinct p-n junction is thereby formed.

For the doping conditions plotted in FIG. 2B, the doped region forming the high-field zone of the buried layer is separated in depth from the cathode doping region in that very sharp doping profiles are achieved. A region having the background doping level of the substrate is thereby vertically interposed between the cathode and the high-field zone of the buried layer. This region is at the background doping level of the substrate. The device cross-sectional view of FIG. 1A is meant to be representationally inclusive of the doping profiles of both FIGS. 2A-2B. In design of the avalanche photodiode, a suitable high-field avalanche region length is specified between the $n^+$ cathode and the high-field zone of the $p^+$ buried layer, based on the voltage range specified for the device, and such can be produced with both p-n and p-π-n structures. For some applications, the p-π-n doping profile of FIG. 2B can be preferred because in general, a central intrinsic region between the $n^+$ and $p^+$ regions can mitigate the risk of forming a p-n tunneling junction and can enable device operation at reduced voltages.

Referring back to FIG. 1A, note that the lateral edges 36 of the central, high-field zone 16 of the buried layer 14 are laterally recessed from the lateral edges 38 of the $n^+$ cathode 12. The high-field zone 16 is thereby laterally recessed from the cathode perimeter. This recess can be preferred for most applications to prevent very high electric field concentration at the cathode perimeter. The curvature of the heavily doped cathode region at the cathode edges can contribute significantly to the electric field generated at those edges, resulting in a higher electric field at the cathode edges than at the middle region of the cathode. To prevent this condition and thereby to produce a substantially uniform electric field and avalanche region between the cathode and the high-field region of the buried layer, the central, elevated zone 16 of the buried layer is preferably laterally recessed. The resulting high-field zone 26 thereby does not extend to the edges of the cathode, and a uniform avalanche region is produced.

The uniformity of the avalanche region is further enforced by the doping profile of the step and mid-field zones of the buried layer. In FIG. 1A, the slope of the step zone 18 of the $p^+$ buried layer is exaggerated for clarity. The slope of step zone 18 is preferably set such that the buried layer depth is that of the mid-field zone 20 at or less than the lateral edge 38 of the cathode. In turn, the depth of the mid-field zone 20 is selected such that an electric field substantially lower than that of the avalanche region 26 is produced in the mid-field zone. These conditions ensure that a locally-concentrated electric field is not produced at the edges of the cathode, and that the absorbed photoelectrons are well-confined to the avalanche region.

As shown in FIG. 1A, channel stops 22, here shown as $p^+$ channel stops, can be included for reinforcing the electric field profile to define the edges of the avalanche photodiode pixel and thus isolate the signal generated by that pixel. As the dimensions of the APD pixel are reduced, crosstalk, a process by which photons generated by hot avalanche electrons are absorbed by adjacent pixels, can increase. To reduce such crosstalk, filled trenches of a conventional configuration can alternatively be employed as physical pixel isolation features. Other such features can in addition or alternatively be included as required for a given application.

Figure 1B:
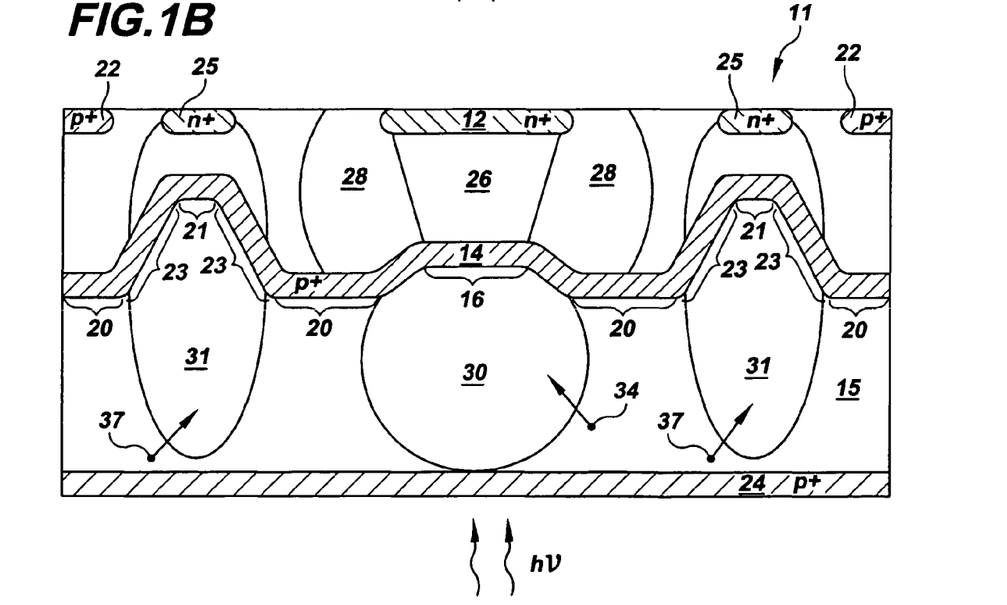

The invention further contemplates the inclusion of additional features for tailoring the electric field profile of the APD. Referring to FIG. 1B, in one such example, an APD structure 11 provided by the invention includes a guard ring structure 25 at the periphery of the cathode 12. The guard ring structure 25 laterally surrounds the APD cathode, e.g., in a circular configuration. FIG. 1B is a cross-sectional view through the APD structure for clarity, but it is to be recognized that the guard ring extends laterally around the cathode 12. The guard ring is provided as, e.g., an $n^+$ region formed simultaneously with the cathode region 12. At the location of the guard ring 25, the depth profile of the buried layer 14 is altered to rise to a more shallow guard ring zone 21. The guard ring zone 21 of the buried layer is connected to the deeper mid-field zone 20 by a second step zone 23. The guard ring zone 21 and second step zone 23 are therefore sections along the continuous buried layer 14 and are of the same doping type and concentration.

Given an $n^+$ guard ring and a $p^+$ buried layer, the guard ring 25 can be biased to produce an electric field potential well region, here termed an aperture region 31 in the substrate 15, that collects excess photogenerated charge 37. Under bright illumination conditions, it can be desired to limit the number of photoelectrons collected by the APD absorption region 30. With the guard ring biased for charge collection at the aperture region 31, a number of photoelectrons will be attracted to the aperture region 31 rather than the absorption region 30, depending on the proximity of the photoelectrons to each of the two regions and the electric field potential of each of the two regions. This aperture region collection reduces the number of photoelectrons collected by the absorption region 30. As a result, the number of photons to be counted is reduced. For photon counting applications, such can be desired under bright illumination conditions. The guard ring structure also can be employed for suppressing blurring of photoelectron capture between neighboring APD pixels. If the APD structure is relatively large laterally, the collection of photoelectrons at the aperture region 31 limits cross-pixel photoelectron collection.

The guard ring zone 21 of the buried layer is preferably a shallow zone. For some applications, it can be desirable for the doping profile of the guard ring zone 21 to overlap with that of the upper guard ring 25. This produces the potential well of the aperture region 31 without the need for a high guard ring voltage bias. In operation, when it is desired to limit the number of photoelectrons captured by the absorption region 30 and/or to limit the number of photoelectrons captured by neighboring APD pixels, the guard ring is biased to create the potential well of the aperture region 31. Then when operating under illumination conditions such as low light level conditions, the guard ring can be maintained without biasing, thereby to eliminate the aperture region 31. Under this condition the APD operates like the structure of FIG. 1A, collecting substantially all photoelectrons from the substrate in the absorption region 30.

The design of the avalanche photodiode of the invention is in most cases best conducted as an iterative process to enable consideration of the many performance trade-offs and operational parameters associated with the device. A simulation tool suite including, e.g., Athena, for microfabrication process steps, and ATLAS, for device operation, both provided by Silvaco, of Santa Clara, Calif., can be used for enabling well-characterized modeling of device design, fabrication, and operation.

The APD structure of the invention can be employed for operation in a range of avalanche modes, including linear avalanche mode and Geiger mode (GM) operation. The doping profile of the structure is adjusted accordingly. For a given selected mode of operation, in designing an APD in accordance with the invention, it is helpful to first specify the voltage range available for application between the anode and cathode for establishing avalanche. The doping profile of the device can then be specified.

An example set of parameters here will aid in illustrating the design process. Given a 5 volt CMOS circuit for APD signal readout, and Geiger mode APD operation of a back-side-illuminated device like that of FIG. 1A, the cathode voltage swing is set at 0 V-5 V. The backside anode is set at a negative bias, e.g., slightly less than about the breakdown voltage characteristic for the device, e.g., around −25 V, to ensure that for a selected avalanche region length, tunneling breakdown does not occur and that the device will not be operating in the linear avalanche mode. The backside anode is specified as a thin layer of heavy doping to enable good ohmic contact and to provide a uniform voltage across the illumination collection surface. The cathode is specified also as a layer of heavy doping to enable good ohmic contact. The peak of the cathode doping profile is preferably near the surface of the device to enable such contact, but deep enough so as to not be affected by doping process variations.

Given a 5 volt CMOS voltage swing and GM-APD operation, the $p^+$ buried layer characteristics are specified to produce high avalanche initiation probability and photoelectron collection efficiency when the cathode is set at 5 volts relative to CMOS circuit ground, and to quench an avalanche event and prevent so-called afterpulsing when the device is disarmed by setting the cathode at 0 volts relative to CMOS circuit ground. Afterpulsing refers to generation of a false illumination detection signal due to charge remaining from a prior avalanche event. If the doping of the buried layer is too low, photoelectron collection efficiency will be high but avalanche initiation probability will be poor; conversely, if the doping is too high, the avalanche initiation probability will be good but the collection efficiency will be poor.

The doping profile characteristics can be further specified by considerations of a selected APD application. For example, for applications such as photon-counting, for which collection time is not in general critical, photoelectron collection by diffusion can be accommodated, as described in connection with FIG. 1A above. The response of the device can be limited by quench time or transit time. Assuming an active quench scenario, a quenching operation lasts on the order of tens of nanoseconds. In contrast, the time of transit of photoelectrons to the absorption region is on the order of nanoseconds. The $p^+$ buried layer characteristics are here set to provide high avalanche initiation probability with relaxed collection time, with the caveat that a reasonable collection efficiency be achieved to prevent image smear caused by photoelectron diffusion. In contrast, for electronic triggering applications, for which there is a desire to minimize photoelectron collection time, photoelectrons are preferably collected by drift, rather than diffusion. To achieve this condition, the buried layer characteristics are adjusted so that punch-through and breakdown occur at approximately the same voltage.

In designing the buried layer to account for these various considerations, a high buried layer doping can first be considered, and preferably simulated, to verify the doping depth profile necessary for the breakdown characteristics of the voltage swing and anode bias. Then the doping can be fine tuned to set both the desired breakdown and punch-through voltages within the applied voltage range. Similarly, electric field profile analyses can be conducted through simulation to ascertain an optimum buried layer high-field zone recess, as well as step zone extent, and mid-field zone depth for given cathode characteristics. In general, it is found that there exists a rather narrow dopant range, e.g., a 10% range, within which the resulting device can operate within a limited voltage range such as the example 5 volt CMOS range given above.

With this or other suitable design methodology, a substantially 100% fill-factor APD can be achieved in accordance with the invention. This methodology applies to front-side as well as back-side illumination configurations. Indeed, the example structures of FIGS. 1A-B are equally suitable for front-side or back-side illumination conditions. As described below, the readout circuitry and associated connections reduce APD fill-factor unless particular designs are employed for maintaining unobstructed pixel regions.

Figure 3:
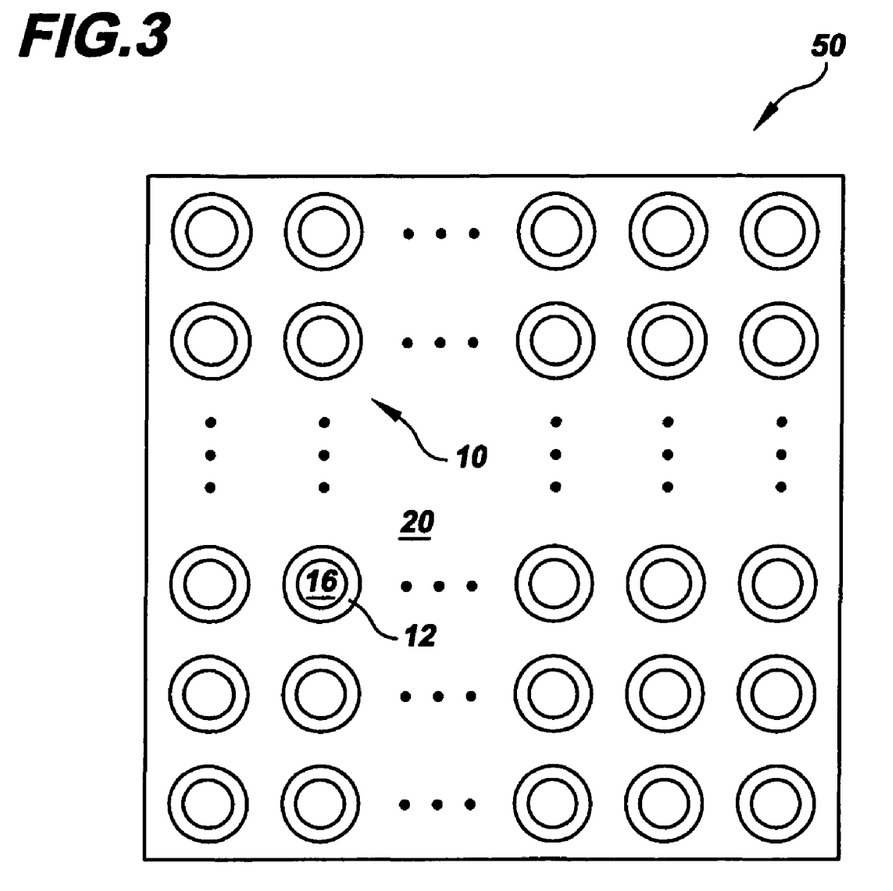
FIG. 3 is a schematic plan view of an example avalanche photodiode pixel array in accordance with the invention.

The avalanche photodiode of the invention can be arranged in any suitable configuration, e.g., in an array of APD pixels 50 as shown in FIG. 3. Each APD pixel 10 can be provided with the cathode 12 and high-field zone 16 of the buried layer in a circular, square, oval, or other selected geometry. The selected geometry preferably is not characterized by distinct points or sharp angles that would produce locally high electric field concentration. The selected geometry also preferably accommodates lateral recess of the high-field zone of the buried layer from edges of the cathode. For clarity, the channel stops of each pixel are omitted from FIG. 3, but it is to be recognized that such are included in the manner following FIGS. 1A-B above.

In the example configuration shown in FIG. 3, the mid-field zones 20 of the buried layer of each of the APD pixels are continuous. With the buried layer extending continuously between pixels, the buried layer produces a blanket mid-field zone buried layer region across the entire device array. While this configuration can be advantageous for many applications and, e.g., for pixels at interior positions of a pixel array, such is not universally required by the invention. For some applications and at some pixel array locations, it can instead be preferred to employ a buried layer that is discontinuous between pixels or that terminates before extending to an edge of a pixel array.

For example, where an APD pixel in an array of such pixels is situated near to an unpassivated edge of the array, it can be preferred to terminate the buried layer to provide a direct path between the cathode and the anode of the pixel at that terminated location. This enables the dark current characteristic of the device to be reduced by non-avalanche absorption of charge associated with that dark current. While the overall pixel array fill-factor is reduced by this configuration, the fill-factor of each pixel remains at substantially 100% for a back-illuminated configuration like that of FIGS. 1A-1B.

As discussed previously, the APD device is well-suited for operation with digital electronics, e.g., CMOS electronics. In Geiger mode operation, this enables effectively noiseless, direct photon-to-digital signal conversion, with a digital pulse indicative of incident photon detection. Digital post-detection signal processing can then be conducted to provide signal data in a desired format and/or for interface with circuitry for a desired application. Any suitable connection between the APD structure and the digital circuitry can be employed in accordance with the invention. CMOS circuitry can be monolithically integrated on the APD substrate, or can be provided separately and suitably connected. For example, conventional wire bonding can be employed to make connections between an APD substrate and a separate CMOS substrate, chip, module, or other digital processing component. Discrete processing components, whether of customized hardware or otherwise, can be configured for connection with a pixel array.

Figure 4A:
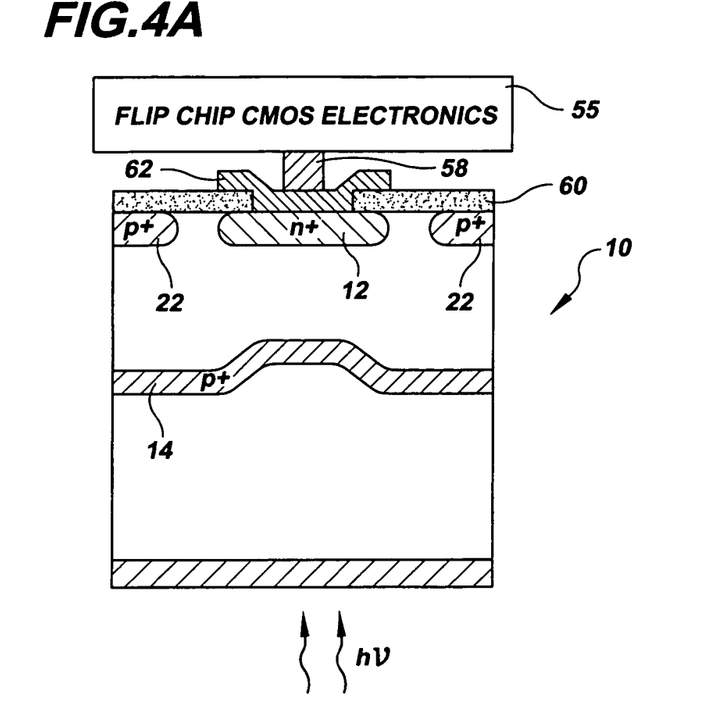
FIG. 4 is a schematic cross-sectional view of an example interconnection between the avalanche photodiode and CMOS electronics in accordance with the invention.

In one connection example, illustrated schematically in FIG. 4A, the APD device 10, configured for back-side illumination, is connected by, e.g., flip chip techniques, to a CMOS electronics module 55. A conventional dielectric passivation layer 60 is here employed, with metallization 62, at the front-side cathode location of the device. This configuration enables back-side illumination and high device fill-factor, while accommodating front-side connection to CMOS circuitry without monolithic integration of that circuitry.

Figure 4B:
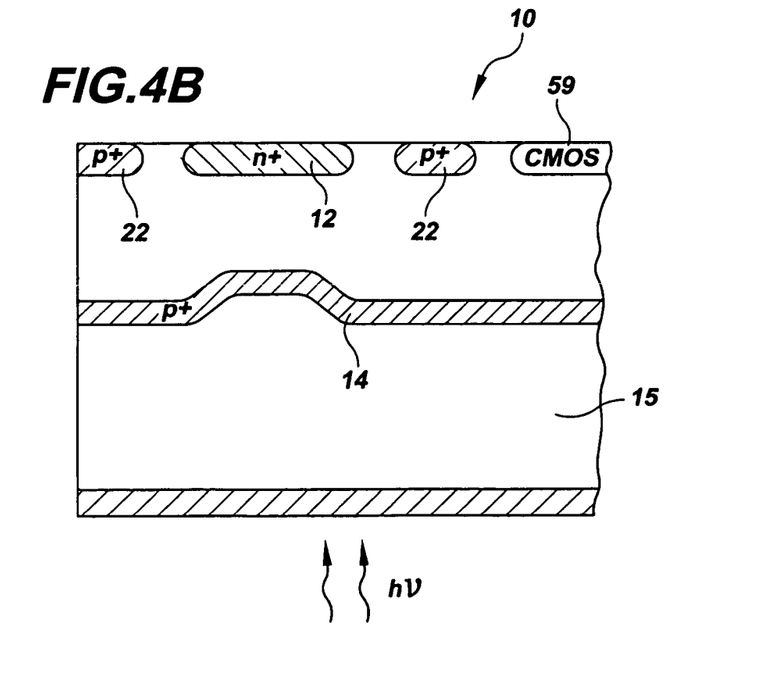

In a second example CMOS connection provided by the invention, shown in FIG. 4B, the APD device 10, configured for back-side illumination, is connected to CMOS circuitry 59 that is monolithically integrated into the substrate layer 15. For clarity the CMOS circuitry is shown schematically. A front-side-illumination APD configuration similarly can be connected with monolithically integrated CMOS circuitry, or with flip chip or other CMOS module, recognizing that the flip chip connection may need to be made to the backside of the substrate. In this scenario, the backside anode doping shown in the structures of FIGS. 1A-1B is unnecessary. Alternatively, to preserve the device fill-factor of a front-side-illuminated device, the connection from each APD cathode to the CMOS electronics is in this case preferably at a substrate location set apart from each pixel, as shown in FIG. 4B, requiring metal lines from each cathode to the connection pad, and possibly requiring light-shielding of the CMOS circuitry.

Read-out and control circuitry connected to the APD device of the invention can be configured as-needed for a given application. As is conventional, an active quenching circuit and pixel reset circuitry can be included for controlling APD avalanche events. In an example circuit configuration, referring to FIG. 5, the avalanche photodiode 10 is connected to an active quench circuit 65, which is connected to a pixel reset circuit 68 and to an application circuit 70, e.g., a counter or a timer circuit.

Figure 5:
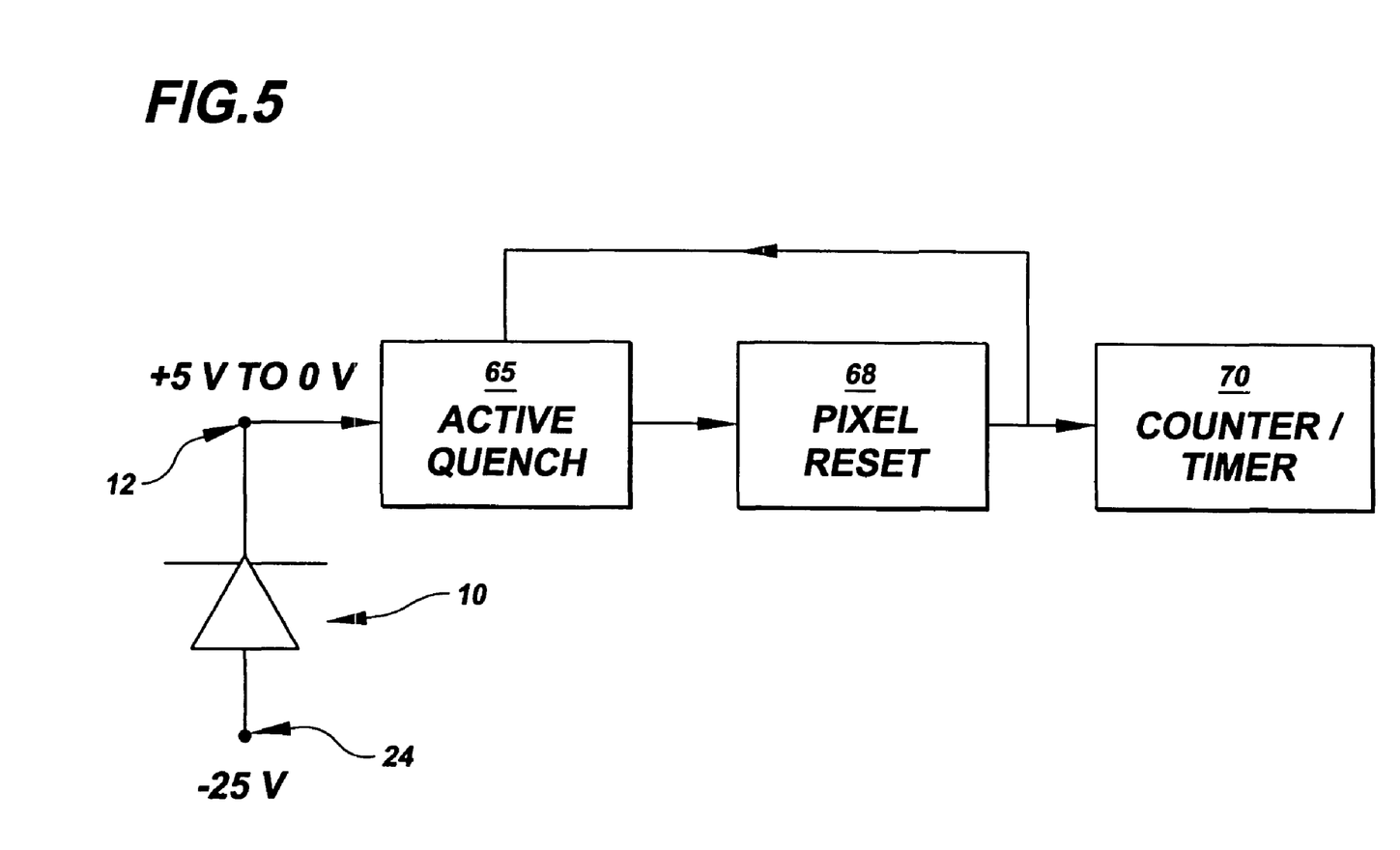
FIG. 5 is a block diagram of an example configuration for read-out and application electronics connected to the avalanche photodiode of the invention.

The pixel reset circuit 68 arms the APD for photocharge collection by setting the voltage of the cathode 12 at the collection voltage, e.g., 5 V for a CMOS circuit configuration with 0 V-5 V swing. The anode 24 of the APD is biased at the corresponding bias voltage, e.g., −25 V for the 5 V CMOS voltage swing. Once illumination of the APD is initiated, the resulting APD avalanche current causes the APD cathode voltage to drop as the capacitance of the APD and the CMOS interface circuitry is discharged. The active quench circuit 65 senses this self-discharge and corresponding voltage drop and sets the voltage of the cathode at, e.g., 0 V, so that the APD is biased below its characteristic breakdown voltage, and the avalanche event is quenched.

After a suitable quench period, during which residual charge, such as trapped charge, in the APD is discharged, the pixel reset circuit 68 rearms the APD by again setting the APD cathode at a collection voltage, e.g., 5 V. The current signal pulse resulting from the APD avalanche event and its quench is directed to the selected application circuitry 70, e.g., counter or timer circuitry, for, e.g., photon counting or electronic triggering. This APD control arrangement is just one example of the many read-out and application circuit configurations that can be employed with the APD of the invention. The invention is not limited to a particular read-out arrangement and is not limited to Geiger mode APD operation; any suitable APD operational mode and read-out circuit configuration can be employed.

Turning now to fabrication of the APD of the invention, an example process for producing the APD device structure of FIG. 1A, configured for backside illumination and employing a p-type substrate, is described below. Such is not meant to be limiting, however; the invention contemplates a range of fabrication techniques and the APD structure does not require a particular fabrication sequence.

Figure 6A:
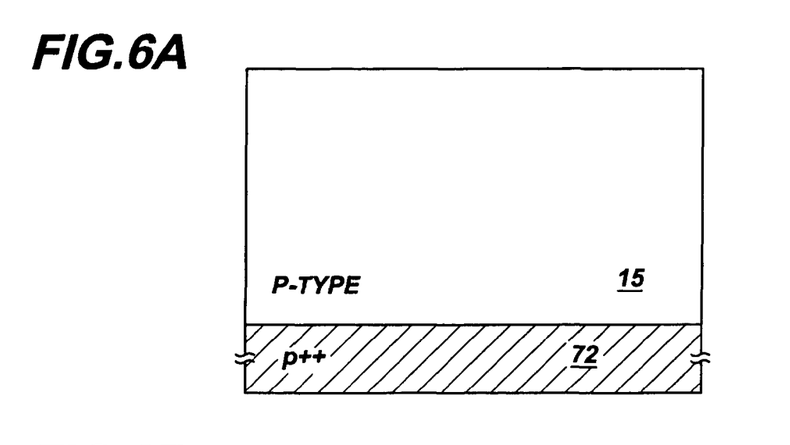
FIGS. 6A-6D are schematic cross-sectional views of the steps in a first example microfabrication process provided by the invention for producing the avalanche photodiode of FIG. 1A.
Figure 6B:
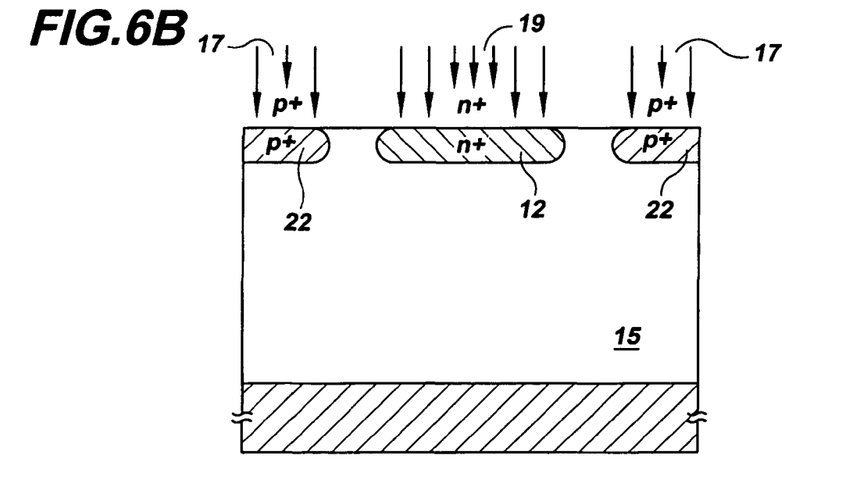

Referring to FIG. 6A, in one example fabrication process for producing the back-side illumination configuration of FIG. 1A, it can be convenient to begin with a handle substrate 72, e.g., a $p^{++}$ silicon wafer substrate, on which is provided a lightly doped p-type silicon epitaxial layer 15. The substrate configuration of FIG. 6A is not shown to scale for clarity. Referring to FIG. 6B, in a first doping step, the $p^+$ channel stops 22 of the APD are formed by, e.g., ion implantation 17 of a p-type dopant, e.g., boron, at a dose of, e.g., about $1 \times 10^{13}$ $cm^{-2}$, through a patterned photoresist mask in the conventional manner. If desired, a 20 nm-thick layer of thermal oxide (not shown) can first be grown on the substrate surface to prevent channeling during the ion implantation. If optical crosstalk between neighboring APD pixels is a concern, then trenches or other selected physical structure can also or alternatively be provided.

At the completion of this first doping process, the $n^+$ cathode 12 is then formed in a second doping process, e.g., by ion implantation 19 of an n-type dopant, e.g., arsenic, e.g., at a dose of about $1 \times 10^{13}$ $cm^{-2}$ and an energy of about 100 KeV, through a photoresist mask in the conventional manner. The ion implantation dopant regions of the cathode 12 and the channel stops 22 can be activated simultaneously, if desired, by an annealing step at the completion of the cathode implantation. In one example of such an activation step, the substrate is subjected to annealing in a nitrogen atmosphere at a temperature of, e.g., about 1000° C. for about 30 min.

Figure 6C:
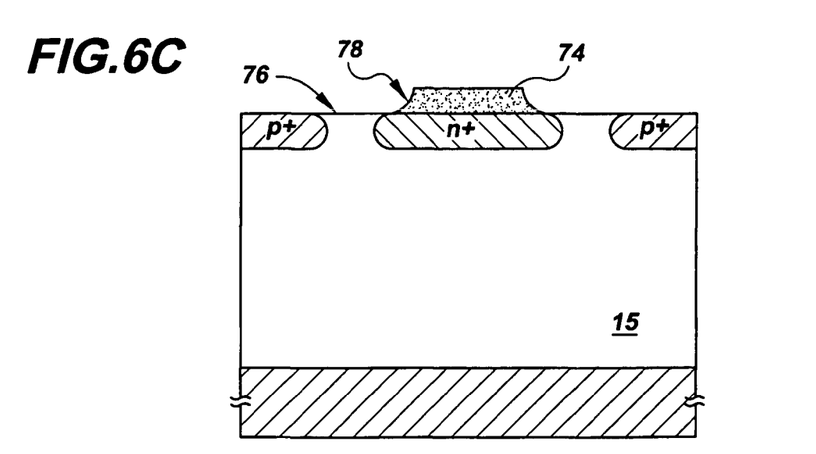

Referring to FIG. 6C, in a next process step a layer of oxide is formed on the front side 76 of the substrate by, e.g., a chemical vapor deposition (CVD) process such as decomposition of tetraethoxysilane (TEOS) or other selected organometallic precursor, or other suitable deposition process. This oxide layer is formed to produce, in a subsequent step, an oxide region 74 to be employed for tailoring an ion implantation profile of the buried layer 14 of the APD as shown in FIG. 1A. The thickness of the oxide layer is specified to produce a desired implantation depth for the central, high-field zone 16 of the buried layer and the mid-field zone 20 of the buried layer. In one example process, the oxide layer is provided with a thickness of about 500 nm.

The oxide layer is patterned and etched with a suitable etch process to produce a desired edge taper 78 of a resulting oxide region 74. This oxide region and edge taper can be achieved by, e.g., a conventional masked HF wet etch or a plasma etch, or other selected etching process, employing a photoresist or other masking layer in the conventional manner. The particular example taper 78 shown in the figures is by way of example only; a linear, curved, or other selected profile can be employed for a desired corresponding buried layer profile.

Figure 6D:
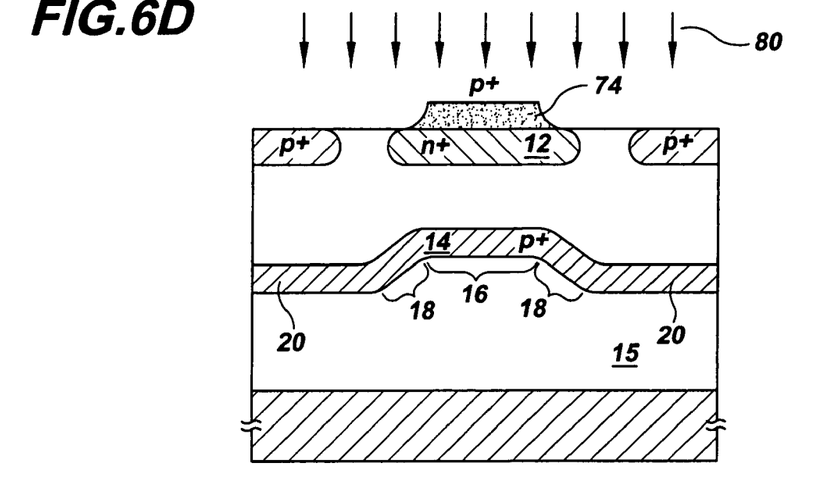

Referring to FIG. 6D, in a next process step, the p$^+$ buried layer 14 is formed, e.g., by ion implantation 80 of boron, through the tapered oxide region 74. In one example process, a boron implantation at a dose of about $2.8 \times 10^{12}$ cm$^{-2}$ and an energy of about 675 KeV is employed. The edge taper 78 of the oxide region 74, together with the oxide layer thickness, results in a graduated step zone 18 in the implanted buried layer 14, between a central high-field zone 16 and mid-field zone 20. The location of the step zone 18 corresponds directly to the location of the tapered edge of the oxide region 74. The oxide region thickness is preferably tuned so that the buried layer implantation process results in a buried layer depth profile enabling avalanche initiation in the central high-field zone while prohibiting breakdown at the step and mid-field zones. Note also that the lateral extent of the oxide region 74 sets the extent to which the high-field zone 16 of the buried layer is recessed from edges of the n$^+$ cathode 12. With the ion implantation complete, the oxide region 74 can then be removed by, e.g., wet etch, plasma etch, or other selected process.

The implanted buried layer can then be activated by any suitable anneal, e.g., a rapid thermal anneal process (RTA) such as 900° C. for 2 min, or other suitable anneal or dopant diffusion process. With this step, the doping profile of the APD pixel of the invention is complete. Final processing steps can then be carried out, e.g., removal of the handle substrate 72, doping of a backside anode 24 and illumination surface as shown in FIGS. 1A-1B, formation of dielectric and metallization on the front side of the device, as shown in FIG. 4, and connection to read-out circuitry in the manner described above.

Figure 7A:
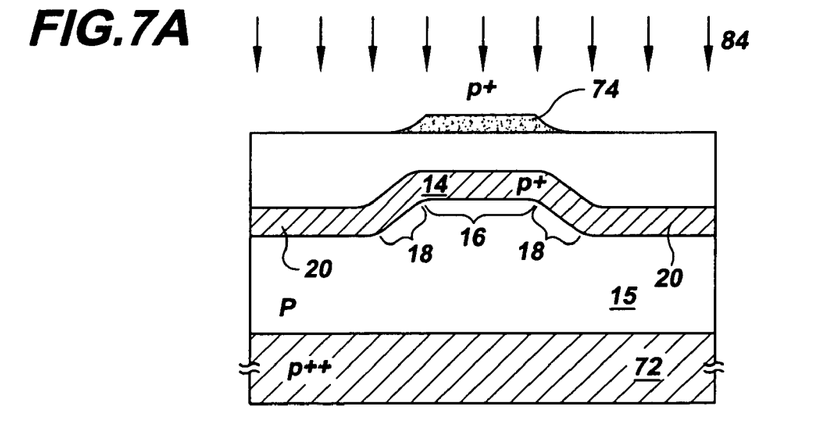
FIGS. 7A-7C are schematic cross-sectional views of the steps in a second example microfabrication process provided by the invention for producing the avalanche photodiode of FIG. 1A.

As explained previously, the invention contemplates a range of fabrication processes for producing the avalanche photodiode of the invention. Referring to FIG. 7A, in an alternative fabrication process, a handle substrate 72 can be provided with a p-type epitaxial layer 15 in the manner described above. Then a tapered oxide region 74 can be produced as described above, for setting a desired p$^+$ buried layer profile. In a next step, the p$^+$ buried layer 14 is formed by implantation 84 of, e.g., boron, through the oxide region 74. Implantation through the oxide region results in an elevated, central high-field zone 16, a step zone 18, and a deeper mid-field zone 20 as previously explained.

In contrast with the buried layer implantation step shown in FIG. 6D, the buried layer implantation in this alternative process is shallow, e.g., employing an implantation energy of about 200 KeV. The implantation energy required is therefore less than that employed for the deeper implantation process shown in FIG. 6D. Thus, for applications in which a relatively low-energy buried layer implantation step is desirable, this process can be preferred over that shown in FIG. 6D, in which a high-energy implantation step is employed. Once the buried layer doping profile is implanted, the implanted ions can be activated by, e.g., RTA or other selected process.

Figure 7B:
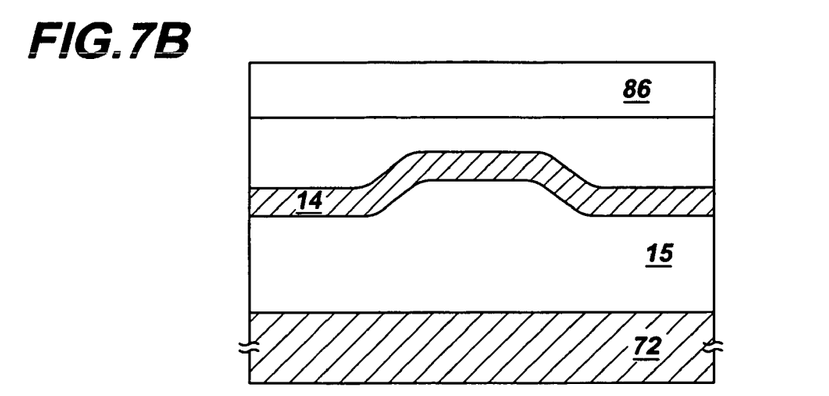

Referring to FIG. 7B, with the buried layer implantation complete, the oxide region 74 is removed by, e.g., wet etch, plasma etch, or other suitable process. Then an epitaxial layer of silicon 86 is grown over the existing epitaxial layer 15, in the conventional manner. This upper epitaxial layer 86 can be tailored in doping and in thickness to correspond to desired properties of the high-field avalanche region between the high-field zone of the buried layer and the cathode of the APD, to be subsequently formed. For example, if an intrinsic or background doping region is to be provided between the high-field zone and the cathode, the thickness and doping of the epitaxial layer can be tailored for producing such.

Figure 7C:
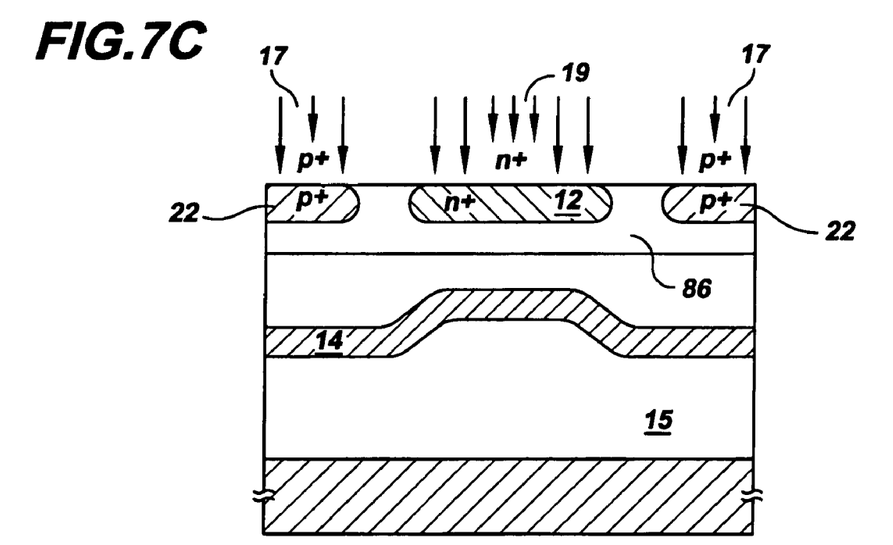

Once the upper epitaxial layer is grown, then in a next step, shown in FIG. 7C, the p$^+$ channel stop regions 22 can be produced by, e.g., boron ion implantation 17. Subsequently the n$^+$ cathode region can be produced by a separate doping process, e.g., arsenic ion implantation 19. A final implantation activation step can then be carried out, e.g., by annealing in the manner described previously. The final doping profile of the APD of the invention is then set. This second example fabrication process results in the same APD structure produced by the first example process. It provides the ability to particularly tailor the material properties of the avalanche region by way of growth of an upper epitaxial layer, and it does not require a high-energy ion implantation step to produce the buried layer. It can therefore for some applications be preferred where such considerations are important. Both example processes enable tailoring of characteristics of the absorber region of the substrate, under the buried layer 14, by way of tailoring of the background doping of the substrate layer.

Figure 8A:
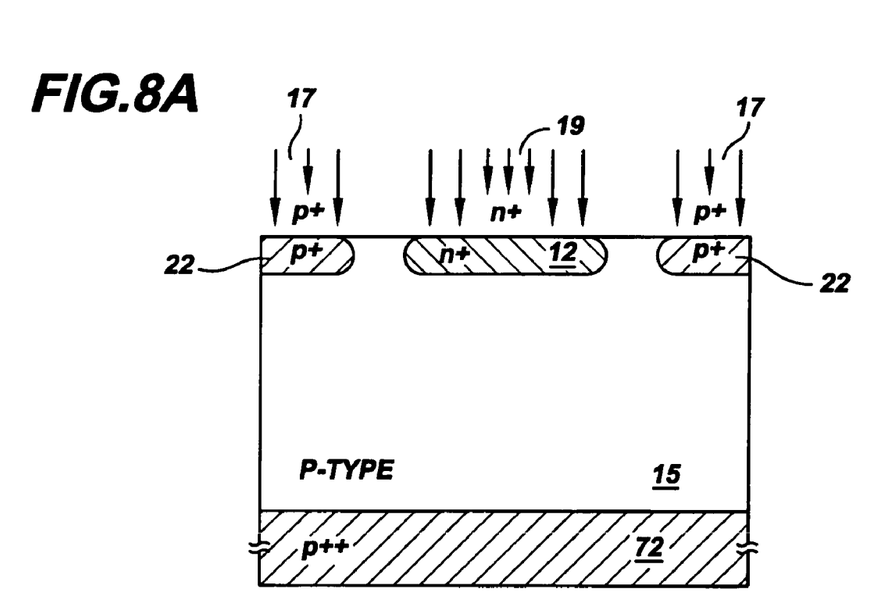
FIGS. 8A-8C are schematic cross-sectional views of the steps in a third example microfabrication process provided by the invention for producing the avalanche photodiode of FIG. 1A.

Referring to FIG. 8A, in a third example fabrication process, a handle substrate 72 can be provided with a p-type epitaxial layer 15 in the manner described above. In a first doping process, the p$^+$ channel stops 22 of the APD are formed by, e.g., a p-type ion implantation 17 of, e.g. boron at a dose of about $1 \times 10^{13}$ cm$^{-2}$ through a patterned photoresist mask in the conventional manner. If optical crosstalk between neighboring APD pixels is a concern, then trenches or other selected physical structure can also or alternatively be provided. Then in the manner described above with regard to FIG. 6B, the n$^+$ cathode 12 is formed in a second doping process, e.g., by ion implantation 19 of arsenic, e.g., at a dose of about $1 \times 10^{13}$ cm$^{-2}$ and an energy of about 100 KeV, through a photoresist mask in the conventional manner. The doped regions forming the channel stops 22 and the cathode 12 can be activated simultaneously, if desired, by an annealing step at the completion of the cathode implantation. In one example of such an activation step, the substrate is subjected to annealing in a nitrogen atmosphere at a temperature of, e.g., about 1000° C. for about 30 min.

Figure 8B:
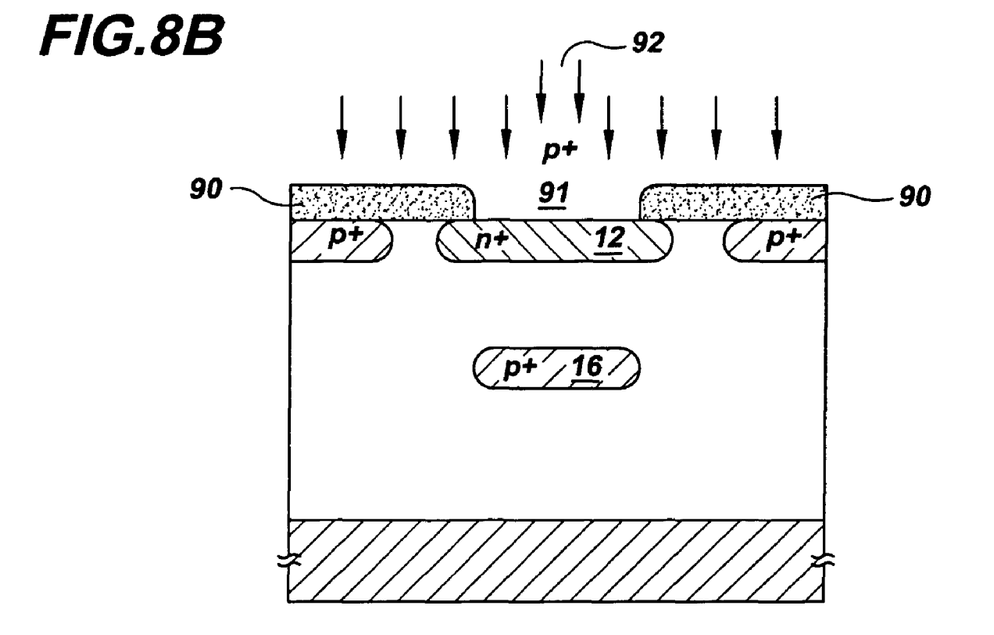

Referring to FIG. 8B, in a next process step, a patterned photoresist mask 90 is formed in the conventional manner. The mask 90 is patterned with an aperture 91 corresponding to the desired location of the high-field region 16 of the p+ buried layer, including a desired lateral recess of the high-field region with respect to the n+ cathode as described previously. A p-type ion implantation step 92 is then carried out, e.g., at a dose of about $2.8 \times 10^{12}$ cm$^{-2}$ and an energy of about 400 KeV to form only the high-field zone 16 of the p+ buried layer.

Figure 8C:
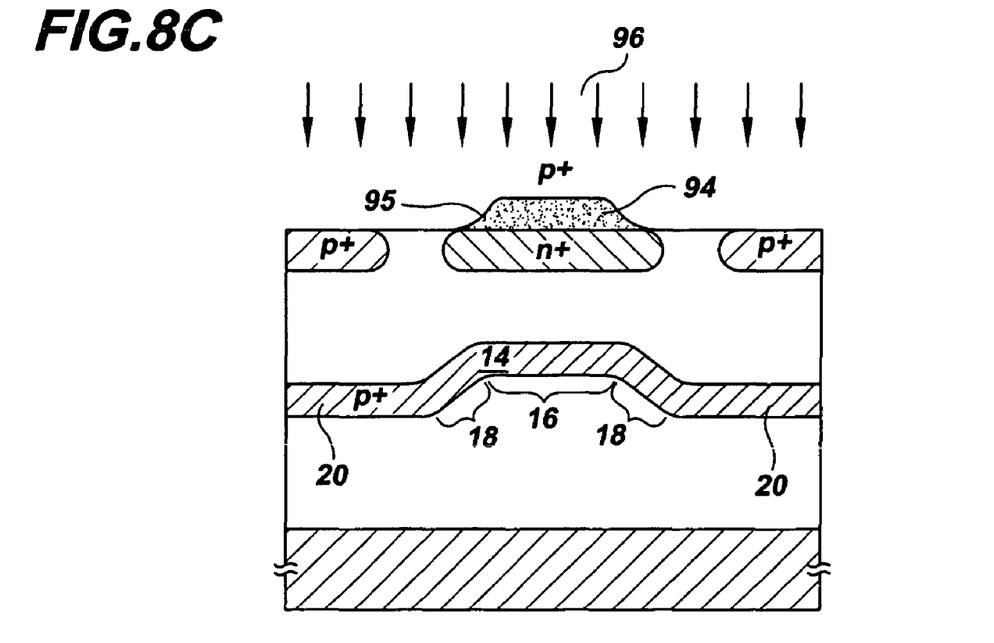

In a next step, referring to FIG. 8C, the patterned photoresist mask layer 90 is then removed and a second patterned photoresist mask layer 94 is formed over the location of the high-field zone 16 of the buried layer. This second photoresist mask layer 94 can be provided with selected edge features, e.g., tapered edges 95, to produce a selected step zone 18 of the buried layer. With the second photoresist mask layer 94 in place, a second p-type ion implantation 96 of selected dose and energy is then carried out to form the step region 18 and the mid-zone region 20 of the buried layer 14. This step can employ a dose and energy distinct from that of the first implantation step, e.g., a dose of about $1 \times 10^{12}$ cm$^{-2}$ and an energy of about 1000 KeV.

After this second ion implantation step, the buried layer doping can be activated by, e.g., RTA or other selected annealing process. The doping profile of the APD device of the invention is then complete. In this third example fabrication sequence, the dual buried layer ion implantation steps enable separate tailoring of the characteristics of the high-field and step zones and the mid-field zone of the buried layer. For applications in which it is preferable to distinctly set the characteristics of these zones in a manner not conveniently achieved by a single implantation step, such can be preferable.

These example fabrication sequences all accommodate the fabrication of the APD guard ring structure of FIG. 1B. In each fabrication sequence, the guard ring 25 (FIG. 1B) can be formed simultaneously with the n+ cathode active region 12. The doping depth profile of the guard ring zone 25 is imposed on the buried layer 14 by including a second oxide region like the first oxide region 74 through which the buried layer ion implantation is carried out. This results in production of the second step zone 23, like the first step zone 20, connecting the mid-field zone 20 of the buried layer to the high-field zone 16 and the guard ring zone 21. Alternatively, masked ion implantation steps like that of FIGS. 8B-8C can be employed to produce the guard ring zone and second step zone.

These three example fabrication sequences demonstrate that the APD device structure of the invention can be produced with a range of techniques. The APD device configuration is not limited to a particular fabrication technique. In addition, other fabrication process steps can be interleaved with the process steps described above as necessary, e.g., for monolithic integration of CMOS circuitry with the APD structure in a common epitaxial layer as shown in FIG. 4B.

Example

The avalanche photodiode doping and electric field profile provided by the invention and shown in FIG. 1A were simulated using the Athena and ATLAS simulation tools described above. Reverse bias breakdown and junction punch-through voltages were estimated for the structure to determine an optimum p+ buried layer ion implantation dose and energy given a 5 V cathode voltage range. Based on initial estimates, the depth of the central, elevated high-field zone 16 of the buried layer 14 from the front surface was set at about 0.6 μm. This high-field zone depth corresponds to an APD breakdown voltage of about 30 V with negligible tunneling currents.

The simulations further specified a buried layer boron ion implantation dose of about $2.8 \times 10^{12}$ cm$^{-2}$ and energy of about 675 KeV, and a tapered oxide region thickness of 500 nm through which the implantation was carried out. These implantation conditions result in good avalanche initiation probability and collection efficiency in the high field avalanche region without breakdown or punch-through at the edges of the n+ cathode. The simulation results indicated that a relatively narrow range of implant doses, e.g., around 10% variation in dose, enables operation within the specified 5 V CMOS voltage swing.

To evaluate the characteristics produced by the dose of the buried layer ion implantation, 6 distinct APD structures were fabricated, all with the 0.6 μm-deep high-field zone of the buried layer. One APD was fabricated with a buried layer ion implantation dose of $2.5 \times 10^{12}$ cm$^{-2}$, two APD structures were fabricated with a buried layer ion implantation dose of $2.7 \times 10^{12}$ cm$^{-2}$, two APD structures were fabricated with a buried layer ion implantation dose of $2.9 \times 10^{12}$ cm$^{-2}$, and one APD structure was fabricated with a buried layer ion implantation dose of $3.1 \times 10^{12}$ cm$^{-2}$. The expectation from simulation data was that punch-through and breakdown voltages would coincide at a dose between about $2.7 \times 10^{12}$ cm$^{-2}$ and $2.9 \times 10^{12}$ cm$^{-2}$.

The Geiger mode breakdown voltage values for each of the four experimental implantation doses were estimated from experimental measurements of the current-voltage (I-V) curves of the devices. The punch-through voltage values for each of the four experimental implantation doses were estimated from experimental measurements of the capacitance-voltage (C-V) curves of the devices. To collect and analyze characteristic APD I-V curves, the APD devices specified above were fabricated as circular devices having a cathode diameter of 60 μm. To collect and analyze characteristic APD C-V curves, the APD devices specified above were fabricated as circular devices having a cathode diameter of 1600 μm in order to increase the overall capacitance.

Figure 9A:
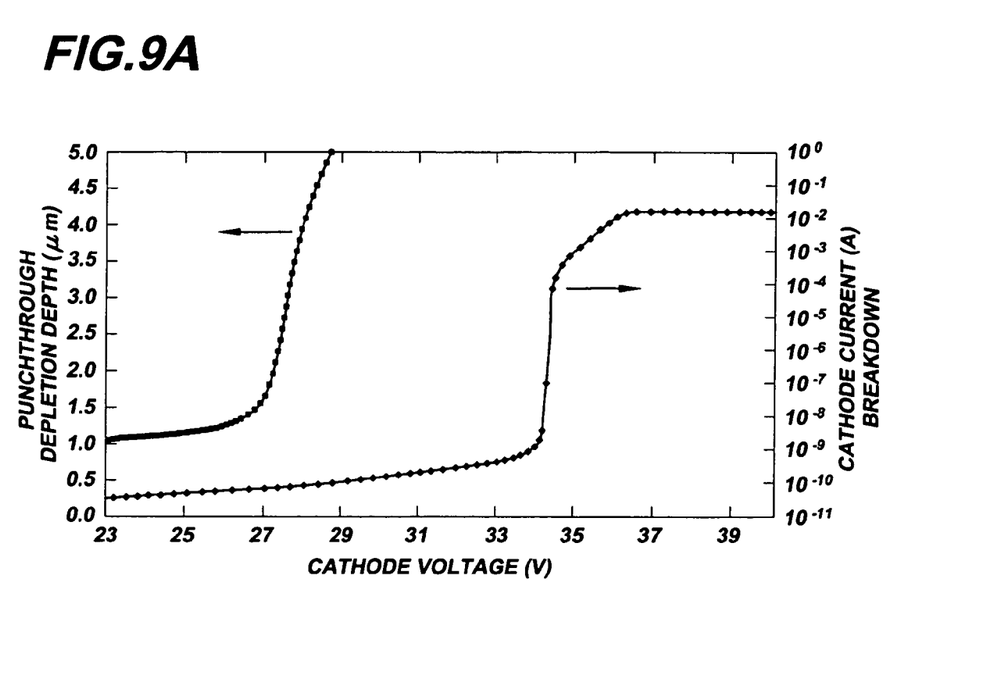
FIGS. 9A-9B are plots produced from experimentally-measured data for determining the punch-through and breakdown characteristics of the avalanche photodiode structure of FIG. 1A fabricated with a $p^+$ buried layer ion implantation dose of $2.7 \times 10^{12}$ cm$^{-2}$, and a dose of $2.9 \times 10^{12}$ cm$^{-2}$, respectively.
Figure 9B:
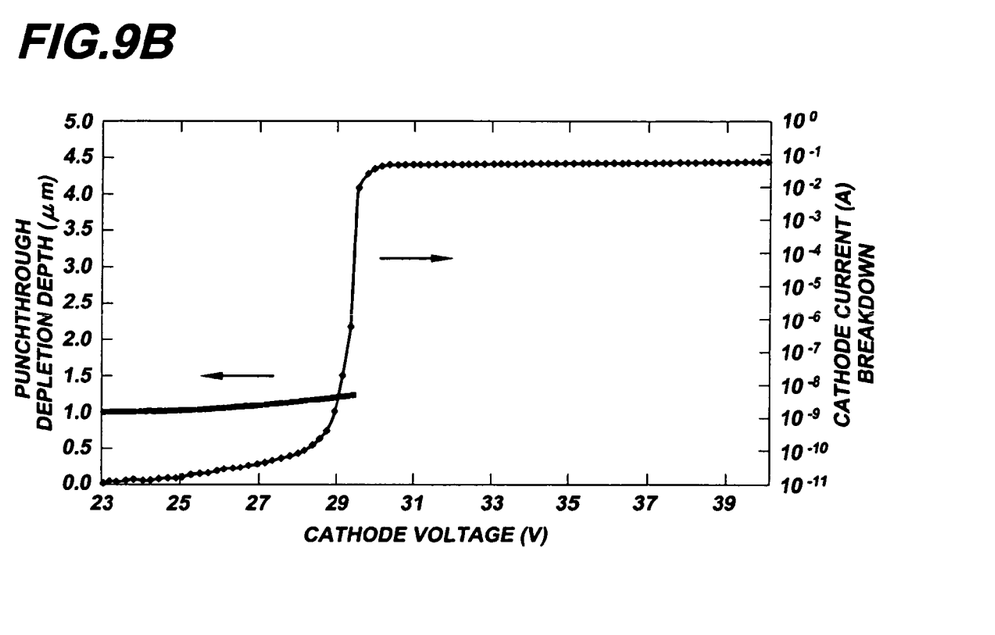

FIG. 9A is a plot of punchthrough and breakdown as a function of cathode voltage for an ion implantation dose of $2.7 \times 10^{12}$ cm$^{-2}$. FIG. 9B is a plot of punch-through and breakdown as a function of cathode voltage for an ion implantation dose of $2.9 \times 10^{12}$ cm$^{-2}$. From these plots it is seen that a dose of $2.7 \times 10^{12}$ cm$^{-2}$ results in a structure in which punch-through occurs below the breakdown voltage. A dose of $2.9 \times 10^{12}$ cm$^{-2}$ results in breakdown occurring prior to punch-through; here punch-through occurs 2 V above the breakdown voltage. This condition results in good avalanche event initiation probability and sufficient charge collection efficiency for, e.g., a photon counting application. This experimental example demonstrates that it can be preferable to design the avalanche photodiode doping profile based on empirical data for producing selected device performance characteristics.

With this discussion, it is shown that the invention provides an avalanche photodiode device design and fabrication process that results in a heretofore unachievable fill factor and device performance. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A photodiode array comprising:
   a semiconductor substrate;
   a plurality of photodiodes, each photodiode including:
   a cathode region of a first dopant type disposed at a first surface of the substrate;
   an anode region of a second dopant type disposed at a second substrate surface opposite the first surface; and
   a buried layer of the second dopant type disposed in the substrate with a high-field zone that is at a first substrate depth and that is aligned with the cathode region for defining an electronic charge avalanche region, with a mid-field zone that is at a second substrate depth greater than the first substrate depth and that is disposed laterally outward of the cathode region, and with a step zone connecting the high-field and mid-field zones; and
   a buried layer extension of the mid-field zone of each of the plurality of photodiodes in the array connected with mid-field zones of adjacent photodiodes as a continuous buried layer.

2. The photodiode array of claim 1 wherein the high-field zone of the buried layer of each photodiode is laterally recessed from edges of the cathode region of that photodiode.

3. The photodiode array of claim 1 wherein the cathode region and the high-field zone of the buried layer of each photodiode are aligned to define between them a vertical photocharge avalanche region in the substrate.

4. The photodiode array of claim 1 wherein the cathode and buried layer regions of each photodiode are aligned to define a vertical Geiger-mode photocharge avalanche region in the substrate.

5. The photodiode array of claim 1 wherein an impurity doping depth profile of the cathode region of each photodiode overlaps with an impurity doping depth profile of the buried layer of that photodiode.

6. The photodiode array of claim 1 wherein an impurity doping depth profile of the cathode region of each photodiode is non-overlapping with an impurity doping depth profile of the buried layer of that photodiode.

7. The photodiode array of claim 1 wherein an n-type active region is configured as the cathode of each photodiode at the first substrate surface.

8. The photodiode array of claim 1 wherein the first substrate surface is a front substrate surface.

9. The photodiode array of claim 8 wherein a back-side substrate surface opposite the front substrate surface is configured to accept incident illumination.

10. The photodiode array of claim 9 wherein the back-side substrate surface comprises an impurity doped surface region configured as an anode.

11. The photodiode array of claim 8 wherein the front substrate surface is configured to accept incident illumination.

12. The photodiode array of claim 1 wherein the connected buried layer extensions of the photodiode mid-field zones form a continuous buried layer in the substrate.

13. The photodiode array of claim 1 further comprising doped channel stop regions of an impurity type of the buried layer and disposed in the substrate at the first substrate surface.

14. The photodiode array of claim 1 wherein the buried layer of each photodiode is configured with an impurity doping depth profile to produce, with the cathode region of each photodiode, an avalanche electric field in the substrate above the high-field zone that is of a greater field strength than a non-avalanche electric field in the substrate above the step zone and above the mid-field zone of each photodiode.

15. The photodiode array of claim 1 further comprising an epitaxial substrate layer disposed between the cathode region of each photodiode and the buried layer.

16. The photodiode array of claim 1 wherein the cathode region and the high-field zone of the buried layer of each photodiode each include rounded edges.

17. The photodiode of claim 1 further comprising a guard ring laterally surrounding the cathode region in the semiconductor substrate at the first substrate surface.

18. The photodiode of claim 17 wherein the buried layer further includes a guard ring zone disposed beneath the guard ring at a third depth in the substrate less than the first depth, and a second step zone connecting the guard ring zone and the mid-field zone.

19. The photodiode of claim 18 wherein the guard ring is n-type and the buried layer is p-type.

20. The photodiode array of claim 9 wherein the front substrate surface is configured for connection to digital circuitry.

21. The photodiode array of claim 11 wherein the front substrate surface is configured with monolithic CMOS circuitry.

22. The photodiode array of claim 1 wherein the substrate comprises a p-type silicon substrate.

23. The photodiode array of claim 1 wherein the buried layer of each photodiode and the substrate comprise a common dopant type.

24. The photodiode array of claim 23 wherein the common dopant type of the buried layer of each photodiode and the substrate is p-type.

25. The photodiode array of claim 7 wherein electrodes of each photodiode consist of the cathode and anode of that photodiode; and wherein the cathode is configured to make an electrical connection for applying to the substrate one voltage bias that produces both an avalanche electric field in the substrate between the cathode and the high-field zone and an electronic charge collection region between the anode and the high-field zone of that photodiode.

26. The photodiode array of claim 1 wherein the substrate and the buried layer comprise a p-type dopant.

* * * * *